(12) United States Patent
Ranish et al.

(10) Patent No.: US 8,761,587 B2
(45) Date of Patent: Jun. 24, 2014

(54) APPARATUS AND METHOD FOR MEASURING RADIATION ENERGY DURING THERMAL PROCESSING

(71) Applicant: Applied Materials, Inc., Santa Clara, CA (US)

(72) Inventors: Joseph M. Ranish, San Jose, CA (US); Blake Koelmel, Mountain View, CA (US); Aaron Muir Hunter, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/903,387

(22) Filed: May 28, 2013

(65) Prior Publication Data

US 2013/0280824 A1 Oct. 24, 2013

Related U.S. Application Data

(62) Division of application No. 12/483,084, filed on Jun. 11, 2009, now Pat. No. 8,452,166.

(60) Provisional application No. 61/077,355, filed on Jul. 1, 2008.

(51) Int. Cl.
*A21B 2/00* (2006.01)

(52) U.S. Cl.
USPC .............................. 392/416; 392/407; 392/418

(58) Field of Classification Search
None
See application file for complete search history.

(56) References Cited

U.S. PATENT DOCUMENTS

| | | | |
|---|---|---|---|
| 5,061,084 A | 10/1991 | Thompson et al. | |
| 5,188,458 A * | 2/1993 | Thompson et al. | 374/121 |
| 5,444,815 A * | 8/1995 | Lee et al. | 392/416 |
| 5,624,590 A * | 4/1997 | Fiory | 219/390 |
| 5,762,419 A * | 6/1998 | Yam | 374/2 |
| 6,086,245 A * | 7/2000 | Yam | 374/2 |
| 6,130,415 A * | 10/2000 | Knoot | 219/502 |
| 6,151,446 A * | 11/2000 | Hunter et al. | 392/416 |
| 6,179,465 B1 * | 1/2001 | Yam | 374/2 |
| 6,299,346 B1 * | 10/2001 | Ish-Shalom et al. | 374/126 |
| 6,345,909 B1 * | 2/2002 | Yam | 374/2 |
| 6,530,687 B1 * | 3/2003 | Suzuki et al. | 374/131 |
| 6,682,216 B1 * | 1/2004 | Small, IV et al. | 374/126 |
| 7,112,763 B2 * | 9/2006 | Hunter et al. | 219/411 |
| 7,985,945 B2 * | 7/2011 | Koelmel et al. | 219/409 |
| 8,032,015 B2 * | 10/2011 | Shibagaki et al. | 392/416 |
| 8,157,439 B2 * | 4/2012 | Timans | 374/129 |
| 8,254,767 B2 * | 8/2012 | Hunter et al. | 392/416 |
| 2004/0079746 A1 * | 4/2004 | Jennings et al. | 219/390 |
| 2007/0238202 A1 * | 10/2007 | Ranish et al. | 438/14 |
| 2009/0277894 A1 * | 11/2009 | Koelmel et al. | 219/409 |

FOREIGN PATENT DOCUMENTS

| | | |
|---|---|---|
| JP | 2006-505946 | 2/2006 |
| WO | 2004/044961 A1 | 5/2004 |

OTHER PUBLICATIONS

Japanese Office Action (with attached English translation) for Application No. 2011-516730; 7 total pages; Dec. 10, 2013.

* cited by examiner

*Primary Examiner* — Thor Campbell
(74) *Attorney, Agent, or Firm* — Patterson & Sheridan, LLP

(57) ABSTRACT

Embodiments of the present invention provide apparatus and method for reducing heating source radiation influence in temperature measurement during thermal processing. In one embodiment of the present invention, background radiant energy, such as an energy source of a thermal processing chamber, is marked within a selected spectrum, a characteristic of the background is then determined by measuring radiant energy at a reference wavelength within the selected spectrum and a comparing wavelength just outside the selected spectrum.

9 Claims, 8 Drawing Sheets

APPARATUS AND METHOD FOR MEASURING RADIATION ENERGY DURING THERMAL PROCESSING

CROSS-REFERENCE TO RELATED APPLICATIONS

This application is a divisional application of a co-pending U.S. patent application Ser. No. 12/483,084, filed Jun. 11, 2009, which claims priority of U.S. Provisional Patent Application Ser. No. 61/077,355, filed Jul. 1, 2008. Each of the aforementioned patent applications is herein incorporated by reference.

BACKGROUND OF THE INVENTION

1. Field

The present invention generally relates to the field of semiconductor processing. More particularly, the present invention relates to methods and apparatus for thermally processing a semiconductor substrate.

2. Description of the Related Art

During semiconductor processing, substrates may be heated to high temperatures so that various chemical and/or physical reactions can take place. Thermal processes are usually used to heat the substrates. A typical thermal process, such as annealing, requires providing a relatively large amount of thermal energy to the substrate in a short amount of time, and thereafter rapidly cooling the wafer to terminate the thermal process. Examples of thermal processes currently in use include Rapid Thermal Processing (RTP) and impulse (spike) annealing.

In general, these thermal processes heat the substrates under controlled conditions according to a predetermined thermal recipe. These thermal recipes fundamentally consist of a temperature that the semiconductor substrate must be heated to the rate of change of temperature, i.e., the temperature ramp-up and ramp-down rates and the time that the thermal processing system remains at a particular temperature.

Accurate temperature measurement is essential to control the process to achieve desired result and to maintain uniformity across the substrate during thermal processing. Temperature measurement of substrates being processed or chamber components is usually conducted in-situ by non-contact methods, such as using pyrometers to sense radiation energy from the target objects. A pyrometer generally detects energy level of a certain wavelength of radiant energy from the target objects to determine temperature of the target objects.

Accuracy of temperature measurement by pyrometers during thermal processing is usually affected by noises received in the radiant energy. For example, when measuring a temperature of a substrate being processed, radiant energy from the energy source may be directly or through reflection received by the sensor in addition to the radiant energy emitted by the substrate.

Various methods have been used to prevent unwanted radiant energy from entering a temperature sensor. For example, covers and shields are used to prevent background noises, such as radiation from the energy source, from entering the sensor. However, the covers and shields not only increase system complexity, reduce system flexibility, but also limit the lower range of the sensors.

Spectral filters are also used to filter out background radiant energy within a working wavelength of the radiant sensor. The working wavelength is generally within a limited range for measuring a semiconductor substrate during thermal processing. Suitable spectral filters, such as a spectral filter containing rare earth elements, are usually expensive. Additionally, spectral filters usually absorb radiant energy from the heating source within the working wavelength. The absorption not only amounts waste of the radiant energy from the heating source, but also causes overheat of the spectral filters themselves.

Therefore, there is a need for improved apparatus and methods for efficient and accurate temperature measurement during thermal processing.

SUMMARY

Embodiments of the present invention generally provide apparatus and methods for accurate temperature measurement during thermal processing. Particularly, embodiments of the present invention provide apparatus and method for reducing background noises, such as radiation from heating source, in temperature measurement during thermal processing.

One embodiment of the present invention provides a chamber for processing a substrate comprising a chamber enclosure defining a processing volume, an energy source configured to direct radiant energy toward the processing volume, a spectral device configured to mark the radiant energy from the energy source towards the processing volume, a substrate support configured to support the substrate in the processing volume, a reference sensor positioned in the processing volume to receive radiant energy, a target sensor positioned in the processing volume to receive radiant energy at a measuring wavelength, and a controller configured to determine a characteristic of the radiant energy from the energy source using measurement of the reference sensor and to determine a temperature of the substrate using measurement of the target sensor and the characteristic of the radiant energy of the energy source.

Another embodiment of the present invention provides a method for processing a substrate comprising directing radiant energy from an energy source towards a processing volume of a thermal processing chamber, marking the radiation energy directed from the energy source to the processing volume, positioning the substrate in the processing volume, measuring radiant energy within the processing volume, determining a characteristic of the radiant energy from the energy source using the measured radiant energy within the processing volume and the marking of the radiant energy from the energy source, and determining a temperature of the substrate using the measured radiant energy within the processing volume and the determined characteristic of the radiant energy from the energy source.

Yet another embodiment of the present invention provides a method for processing a substrate comprising directing radiant energy from an energy source towards a processing volume of a thermal processing chamber, marking the radiation energy directed from the energy source to the processing volume, positioning the substrate in the processing volume, measuring radiant energy in the processing volume at a reference wavelength, determining a characteristic of the radiant energy from the measurement at the reference wavelength, measuring radiant energy in the processing volume at a measuring wavelength, and determining a temperature of the substrate using measurement at the measuring wavelength and the determined characteristics of radiant energy from the energy source.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide apparatus and method for identifying or characterizing heating source radiation in temperature measurement during thermal processing. In one embodiment of the present invention, background radiant energy, such as an energy source of a thermal processing chamber, is marked within a selected spectrum, a characteristic of the background is then determined by measuring radiant energy at a reference wavelength within the selected spectrum and a comparing wavelength just outside the selected spectrum. In one embodiment, temperature of a target, such as a substrate being processed, is determined using measurement of radiant energy at a measuring wavelength outside the selected spectrum and the characteristics of the background. Because the reference wavelength is different from the measuring wavelength, the background may be marked at a spectrum with limited thermal loss and simultaneously the target can be measured at a wavelength of high thermal visibility.

Figure 1:
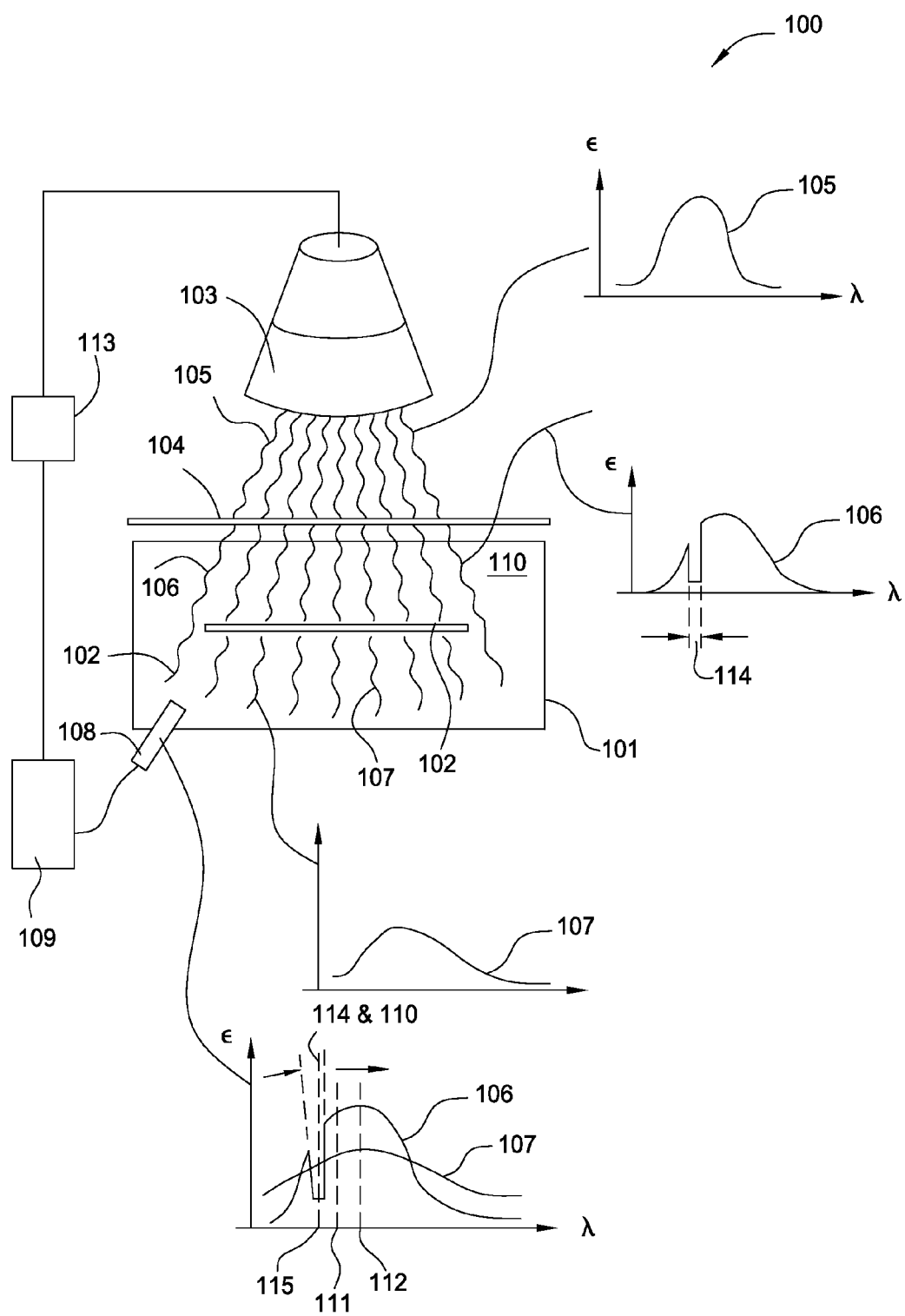
FIG. 1 is a schematic view of a thermal processing chamber in accordance with one embodiment of the present invention.

FIG. 1 is a schematic view of a thermal processing chamber 100 in accordance with one embodiment of the present invention. The processing chamber 100 generally comprises a chamber body 101 defining a processing volume 110 in which a substrate 102 may be thermally processed. An energy source 103 is disposed outside the chamber body 101 and is configured to direct radiant energy 105 towards the processing volume 110 through a window 104.

A sensor assembly 108 is disposed in position to measure an attribute of components in the interior of the chamber body 101. In one embodiment, the sensor assembly 108 is configured to measure temperature of the substrate 102 by obtaining and measuring radiant energy from the substrate 102. The sensor assembly 108 may be connected to a system controller 109, which is configured to determine temperature or other characteristics of the components in the chamber body 101 according to radiant energy received by the sensor assembly 108. In one embodiment, the system controller 109 can also adjust the energy source 103 according to the measurement from the sensor assembly 108.

In one embodiment, the radiant energy 105 from the energy source 103 may be treated or marked prior to or while entering the processing volume 110 as radiant energy 106. As a result, the sensor 108 may be able to distinguish and/or separate radiant energy 107 originated from target objects, such as the substrate 102, from the radiant energy 106 during processing.

The radiant energy 105 may be treated via polarization, reflection, absorption, addition of markers, or combinations thereof. The radiant energy 105 from the energy source 103 may be treated across the entire spectrum, or only a selected spectrum of the radiant energy 105 is treated.

In one embodiment, the radiant energy 105 from the energy source 103 is marked within a selected spectrum upon entering the processing volume 110. Marking of the energy source may be achieved using an absorber, a reflector, or a polarizer configured to absorb, reflect, or polarize radiant energy within the selected spectrum.

In one embodiment, an absorber, a reflector, or a polarizer, may be disposed inside or outside the window 104.

As a result, only marked radiant energy 106 from the energy source 103 enters the processing volume 110. In one embodiment, as illustrated in FIG. 1, only a portion of radiant energy in a selected spectrum 114 enters the processing volume 110.

The sensor assembly 108 receives both radiant energy 107 from the substrate 102 and the marked radiant energy 106 from the energy source 103. In one embodiment, the sensor assembly 108 comprises a reference sensor works at a reference wavelength 115, which is within the selected spectrum 114, and a comparing sensor works at a comparing wavelength 111 which is right outside the selected spectrum 114. In one embodiment, the comparing wavelength 111 and the reference wavelength 115 are substantially close so that the intensity difference of the original radiant energies 105, 107 at the wavelengths may be ignored.

Characteristics of received radiant energy, such as a ratio of radiant energy from the energy source 103 and the substrate 102 at the comparing wavelength 111, may be determined using the measurements of the sensor assembly 108 at the reference wavelength 115 and the comparing wavelength 111. Methods for determining the characteristics are described in accordance with FIGS. 2-8.

The intensity of radiant energy 107 at the comparing wavelength 111 may be approximately calculated from the measurement at the reference wavelength 115 and the comparing wavelength 111 when effects of marking, for example, a ratio of radiant energy being absorbed, is known. In one embodiment, temperature of the substrate 102 can be determined from the approximate intensity of radiant energy 107 at the comparing wavelength 111.

In one embodiment, more accurate temperature measurement of the substrate 102 can be obtained from measuring radiant energy at a measuring wavelength 112, at which the radiant energy 107 of the substrate 102 relatively high and easy to detect. At the measuring wavelength, intensity of the radiant energy 107 equals the radiant energy measurement minus intensity of the radiant energy 106 obtained according to measurements at the reference wavelength 115 and the comparing wavelength 111.

In one embodiment, the system controller 109 is connected to a power source 113 of the energy source 103. The system controller 109 may monitor the power level of the power source 113. The power level of the power source 113 can be used to generate a spectrum signature of the energy source 103 during processing. For example, the coordinated color temperature of a black body source may be known of a function of power level. The spectrum signature can be used in combination with the measurement at the reference wavelength 115 and the comparing wavelength 111 to determine the intensity of radiant energy 105 across the entire spectrum, including intensity at the measuring wavelength 112.

Figure 2:
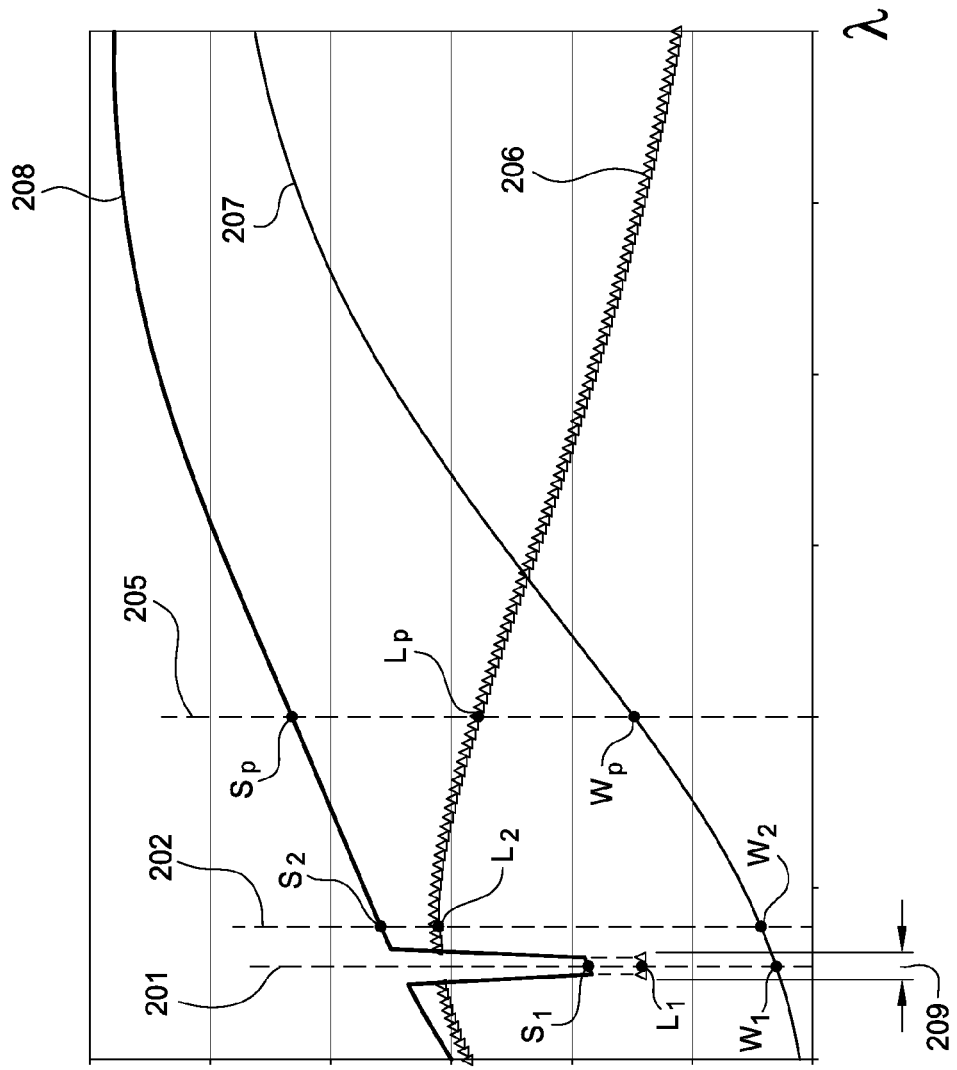
FIG. 2 is a schematic plot of radiation spectrums from a target and a heating source showing a method in accordance with one embodiment of the present invention.

FIG. 2 is a schematic plot showing radiation spectrums in a thermal processing chamber. The x axis indicates wavelength and y axis indicates relative intensity of radiant energy. FIG. 2 illustrates relative intensity of radiant energy 206 from a heating source, such as the energy source 103 of FIG. 1, and relative intensity of radiant energy 207 from a target, such as the substrate 102 of FIG. 1. FIG. 2 also illustrates intensity of combined radiation energy 208 from the heating source and the target. Thermal sensors generally receive the combined radiant energy 208 while the radiant energy 207 is needed to identify attributes, such as temperature, of the target. Embodiments of the present invention provide method and apparatus to accurately obtain the radiant energy 207 by measuring the combined radiant energy 208.

In one embodiment of the present invention, a selected spectrum 209 of the radiant energy 206 from the heating source is marked by a marking device, such as an absorber, or a reflector. The marking of the radiant energy 206 may be implemented by lining a window between the heating source and the processing chamber with the marking device. In one embodiment, the attenuation of the marking device is known. As shown in FIG. 2, a known portion of the radiant energy 207 is filtered out from the processing chamber. As a result, the combined energy 208 is also notched at the selected spectrum 209.

In one embodiment, a first thermal sensor is configured to measure the combined radiant energy 208 at a reference wavelength 201, which is within the selected spectrum 209. The measurement of the first thermal sensor can be denoted by:

$$S_1 = W_1 + L_1 = W_1 + RL_1^0 \quad \text{Equation 1}$$

wherein $S_1$ is the measurement, $W_1$ is the intensity of radiant energy from the target, $L_1$ is the intensity of radiant energy from the heating source after attenuation, R is the attenuation of the marking device and is known, and $L_1^0$ is the intensity of radiant energy from the heating source prior to attenuation. In one embodiment, the attenuation of the marking device is about 0.3 to about 0.01.

A second thermal sensor is configured to measure the combined radiant energy 208 at a comparing wavelength 202, which is just outside the selected spectrum 209 and relatively close to the reference wavelength 201. The measurement of the second thermal sensor can be denoted by:

$$S_2 = W_2 + L_2 \quad \text{Equation 2}$$

wherein $S_2$ is the measurement, $W_2$ is the intensity of radiant energy 207 from the target, and $L_2$ is the intensity of radiant energy from the heating source.

In one embodiment, $W_2$, the intensity of radiant energy 207 from the target, may be approximately calculated from the measurements $S_1$, $S_2$ when the reference wavelength and the comparing wavelength are close enough that the intensities of radiant energies 206, 207 at wavelength 201 and wavelength 202 are approximately the same, i.e. $W_2 \approx W_1$ and $L_2 \approx L_1^0$. Thus, $$W_2 \approx W_1 = (S_1 - RS_2)/(1-R) \quad \text{Equation 3}$$

Figure 6:
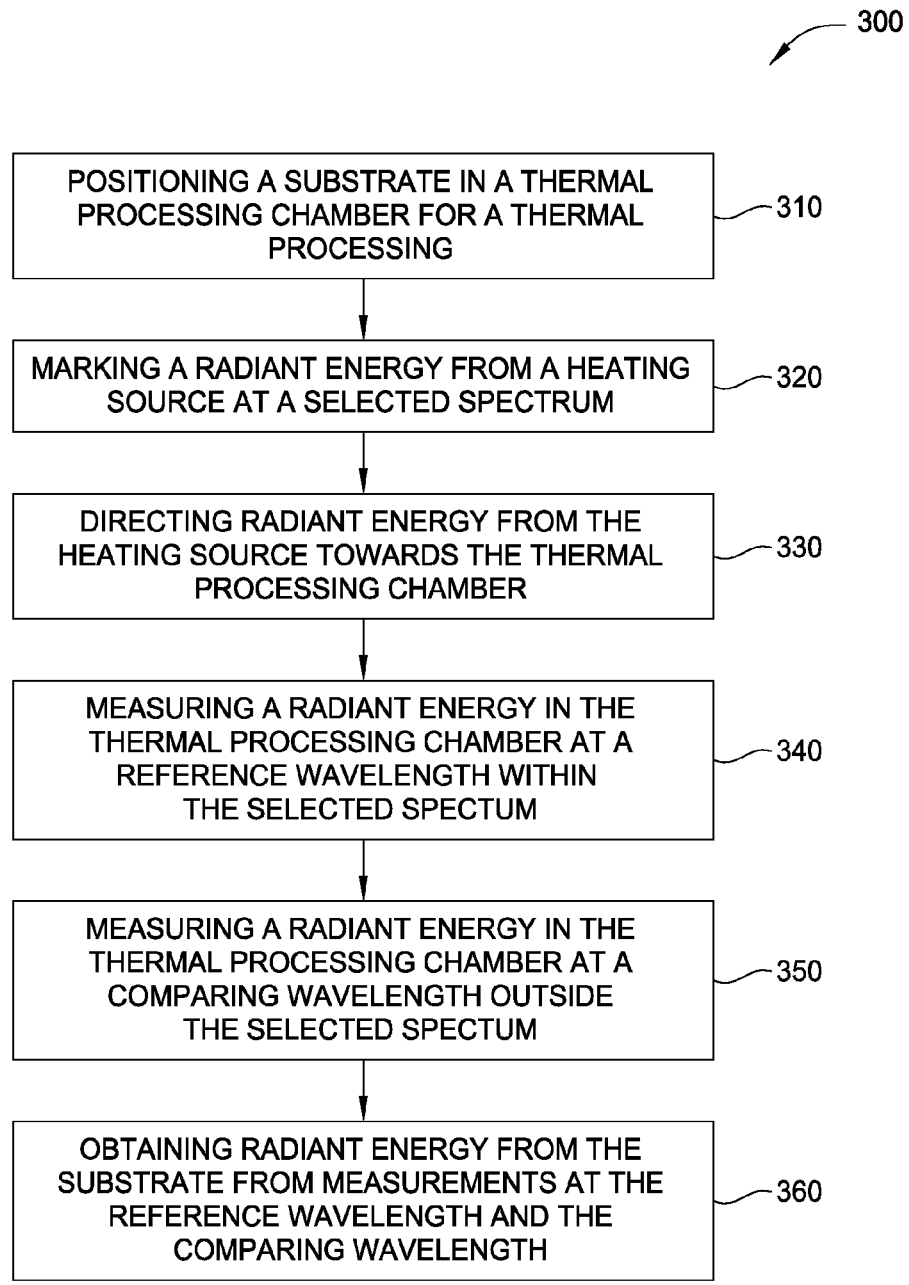
FIG. 6 is a flow chart showing a method for measuring temperature during thermal processing in accordance with one embodiment of the present invention.

FIG. 6 is a flow chart showing a method 300 for measuring temperature during thermal processing as illustrate in FIG. 2.

In box 310, a substrate is positioned in a thermal processing chamber to be thermally processed.

In box 320, radiant energy from a heating source, such as a lamp assembly, is marked at a selected spectrum, such as the selected spectrum 209 of FIG. 2. The marking can be performed by absorbing, reflection, or polarization.

In box 330, radiant energy from the heating source is directed towards the thermal processing chamber. In one embodiment, the radiant energy may be directed to the thermal processing chamber through a quartz window of the thermal processing chamber, and the marking device can be a filter lined on the quartz window.

In box 340, radiant energy in the thermal processing chamber is measured at a reference wavelength, which is within the selected spectrum.

In box 350, radiant energy in the thermal processing chamber is measured at a comparing wavelength, which is right outside the selected spectrum.

In box 360, radiant energy from the substrate may be obtained from the measurements of radiant energy at the reference wavelength and the comparing wavelength. In one embodiment, the radiant energy of the substrate may be obtained using Equation 3. Attributes of the substrate, such as temperature, can be obtained from the radiant energy calculated.

Figure 3:
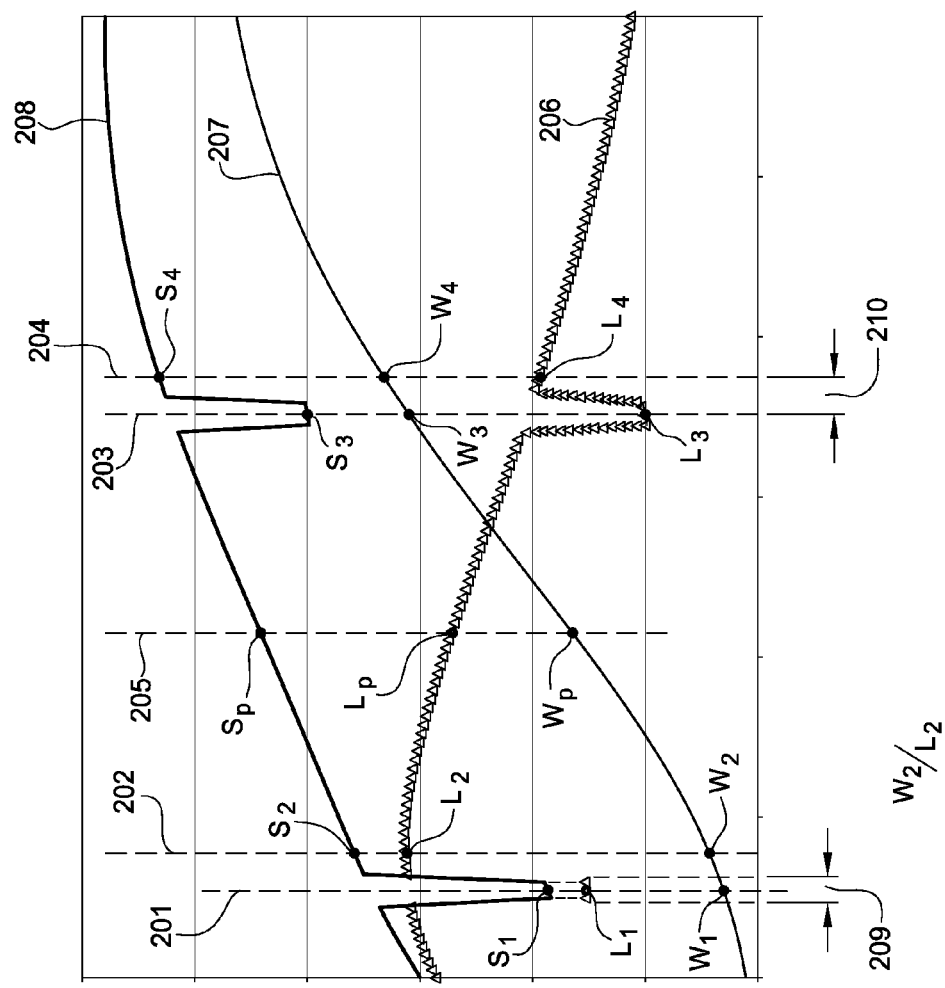
FIG. 3 is a schematic plot of radiation spectrums from the target and the heating source showing a method in accordance with one embodiment of the present invention.

In one embodiment, accuracy of the thermal measurement may be increased by measuring at a wavelength where the radiant energy 207 is relatively stronger. However, the ideal wavelength for measuring the radiant energy 207 is likely to be different from the ideal wavelength for marking the radiant energy 206 of the heating source. FIG. 3 illustrates a method in accordance with another embodiment of the present invention which allows marking and measuring at different wavelength.

FIG. 3 is a schematic plot of radiation spectrums from the target and the heating source of FIG. 2. Similar to FIG. 2, the radiant energy 206 from the heating source is marked at the selected spectrum 209, and first and second sensors are used to measure radiant energy at the reference wavelength 201 within the selected spectrum 209 and at the comparing wavelength 202 right outside the selected spectrum 209.

Additionally, the radiant energy 206 from the heating source is marked at a second selected spectrum 210 different from the select spectrum 209 in the similar manner. A third sensor is used to measure radiant energy 208 at a second reference wavelength 203 within the second selected spectrum 210. A fourth sensor is used to measure radiant energy 208 at a second comparing wavelength 204 right outside the second selected spectrum 210.

By marking two selected spectrum of the heating source and using four thermal sensors, a ratio of the radiant energy 206 from the target and the radiant energy 207 from the heating source can be calculated along the spectrum, thus allowing obtaining the radiant energy 207 of the target from measurements at wavelength outside the selected spectrums 209, 210.

According to Equations 1 and 2, and the approximation that $W_2 \approx W_1$ and $L_2 \approx L_1^0$, the radiant energy 206 at the comparing wavelength 202 is, $$L_2 = (S_2 - S_1)/(1-R) \qquad \text{Equation 4}$$

The measurement of the third thermal sensor can be denoted by:

$$S_3 = W_3 + L_3 = W_3 + R'L_3^0 \qquad \text{Equation 5}$$

wherein $S_3$ is the measurement, $W_3$ is the intensity of radiant energy 207 from the target, $L_3$ is the intensity of radiant energy from the heating source after attenuation, $L_3^0$ is the intensity of radiant energy from the heating source prior to attenuation, and R' is the attenuation of the second marking device.

The measurement of the fourth thermal sensor can be denoted by:

$$S_4 = W_4 + L_4 \qquad \text{Equation 6}$$

wherein $S_4$ is the measurement, $W_4$ is the intensity of radiant energy 207 from the target, and $L_4$ is the intensity of radiant energy from the heating source.

According to Equations 5 and 6, the approximation that $W_3 \approx W_4$ and $L_4 \approx L_3^0$, the radiant energy 206 at the comparing wavelength 204 is, $$L_4 = (S_4 - S_3)/(1-R') \qquad \text{Equation 7}$$

In one embodiment, the radiant energy 206 at a measuring wavelength 205 can be calculated as a function wavelength according to $L_2$ and $L_4$. Thus, $$L_p = F(p, L_2, L_4) \qquad \text{Equation 8}$$

where p is the corresponding wavelength to $L_p$. F can be any suitable function that reflects spectrum characteristics of the radiant energy 206. In one embodiment, the function F may be a linear interpolation. In another embodiment, F may be derived from Plank's law or be empirically determined.

In one embodiment, a fifth sensor is used to measure the radiant energy at the measuring wavelength 205, which may be chosen to be ideal for measuring radiant energy from the target, such as a substrate. The measurement from the fifth sensor at the measuring wavelength 205 can be denoted as:

$$S_p = W_p + L_p \qquad \text{Equation 9}$$

wherein $S_p$ is the measurement, $W_p$ is the intensity of radiant energy 207 from the target, and $L_p$ is the intensity of radiant energy from the heating source.

$W_p$, the intensity of radiant energy 207 from the target, can be approximately calculated from the measurements $S_p$, and the radiant energy $L_p$. Thus, $$W_p = S_p - L \qquad \text{Equation 10}$$

Figure 7:
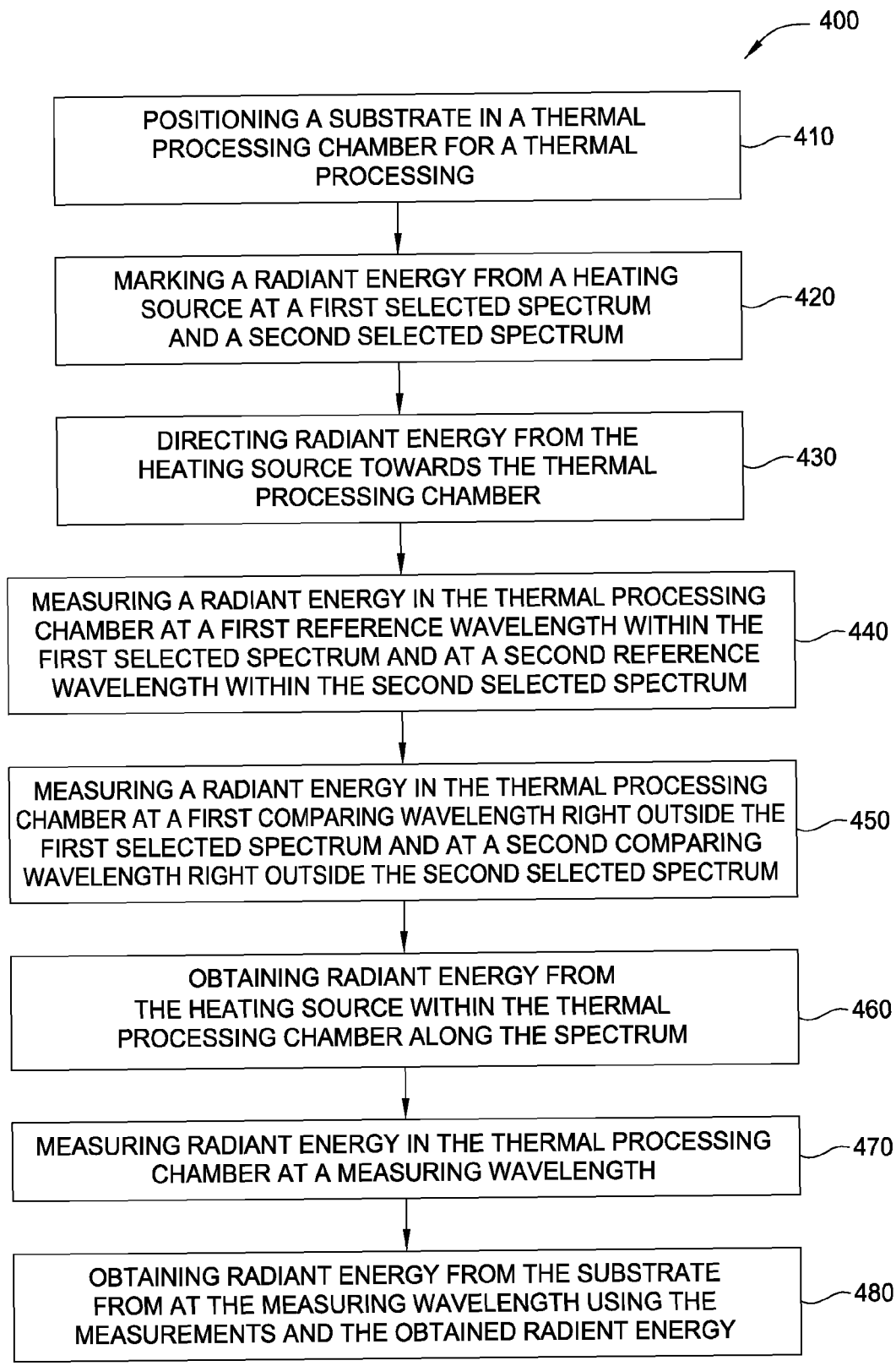
FIG. 7 is a flow chart schematically illustrating a method for measuring target temperature in accordance with one embodiment of the present invention.

FIG. 7 is a flow chart showing a method 400 for measuring temperature during thermal processing as illustrate in FIG. 3.

In box 410, a substrate is positioned in a thermal processing chamber to be thermally processed.

In box 420, radiant energy from a heating source, such as a lamp assembly, is marked at two selected spectrums, such as the selected spectrums 209 and 210 of FIG. 2. The marking can be performed by absorbing, reflection, or polarization.

In box 430, radiant energy from the heating source is directed towards the thermal processing chamber. In one embodiment, the radiant energy may be directed to the thermal processing chamber through a quartz window of the thermal processing chamber, and the marking device can be a filter lined on the quartz window.

In box 440, radiant energy in the thermal processing chamber is measured at two reference wavelengths within the two selected spectrum respectively.

In box 450, radiant energy in the thermal processing chamber is measured at two comparing wavelengths, which are right outside the corresponding selected spectrums.

In box 460, the radiant energy from the heating source can be obtained from the measurements at the reference wavelengths and the comparing wavelength across the spectrum. Equations 4, 7 and 8 can be used to obtain the radiant energy from the energy source across the spectrum.

In box 470, radiant energy is measured at a measuring wavelength, which may be chosen to be the wavelength with radiant energy most effectively reflects attributes of the substrate.

In box 480, radiant energy from the substrate at the measuring wavelength can be determined using the measurement at the measuring wavelength and the obtained radiant energy from the energy source. Equation 10 may be used for determination.

Figure 4:
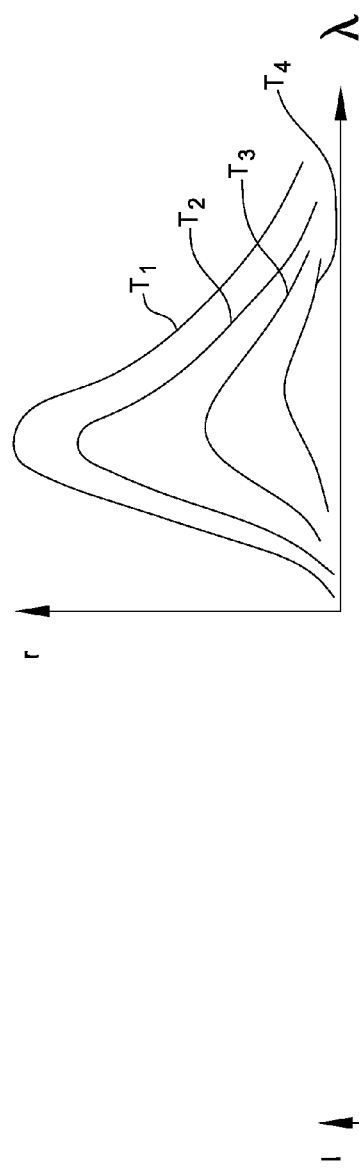
FIG. 4 is a schematic plot illustrating spectrum signature of a heating source at different temperatures.
Figure 5:
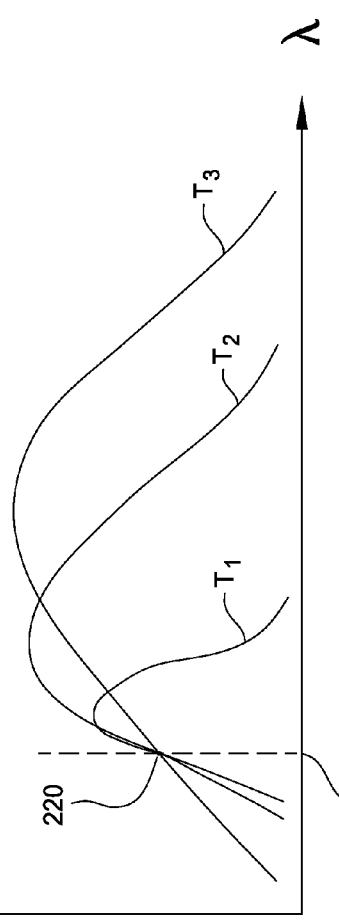
FIG. 5 is a schematic flow chart illustrating a method for measuring target temperature in a thermal processing chamber in accordance with one embodiment of the present invention.

In another embodiment, temperature or other attributes of the substrate can be measured during thermal processing using measurement at wavelength different from the marked wavelength and a spectrum signature of the heating source, as described with FIGS. 4 and 5.

FIG. 4 is a schematic plot illustrating spectrum signature of a heating source at different temperatures. The x axis indicates wavelength. The y axis indicates relative intensity of radiation. It has been observed that thermal radiation occurs at a wide range of frequencies. For a specific object, the main frequency of emitted radiation increases as temperature increases and relative intensity of radiation across the spectrum has a specific shape for different temperatures. The different shape of relative intensity of radiation across the spectrum may be identified as spectrum signature. As schematically illustrated in FIG. 4, a heating source, for example a heating lamp, has a unique shape of relative intensity across the spectrum. In FIGS. 4, T1, T2, T3, and T4 are different temperatures and T1 is higher than T2, which is higher than T3, which is higher than T4.

Accordingly, if the temperature of the heating source is known and an intensity of the radiation from the heating source at specific wavelength is also known, the intensity of the radiation from the heating source in the entire spectrum can be calculated according to the spectrum signature.

FIG. 5 is a schematic flow chart illustrating a method for obtaining a radiation profile across the spectrum when radiation intensity 220 at a specific wavelength 221 is known. The x axis indicates wavelength and y axis indicates intensity of radiant energy. As shown in FIG. 5, profile of the radiant energy can be determined from the known intensity 220 at the wavelength 221 when the temperature of the heating source is known. The curves in FIG. 5 may be derived from the spectrum signatures in FIG. 4. In one embodiment, the curves in FIG. 5 is derived from the spectrum signatures of FIG. 4 by scaling.

Referring back to FIG. 2, the radiant energy 206 of the heating source at the comparing wavelength 202 can be calculated from Equation 4, $L_2 = (S_2 - S_1)/(1-R)$.

The temperature of the heating source can be obtained by various methods, such as by monitoring a power level to the heating source. Thus, the radiant energy 206 from the heating source can be calculated from:

$$L_p = G(L_2, T, p) \qquad \text{Equation 11}$$

where G is a function corresponding to spectrum signature of the heating source, and T is the temperature of heating source, and p is a random wavelength. Spectrum signature of the heating source can be obtained by empirical methods.

Referring to FIG. 2 again, a sensor is used to measure the radiant energy at the measuring wavelength 205, which may be chosen to be ideal for measuring radiant energy from the target, such as a substrate. The measurement from the fifth sensor at the measuring wavelength 205 can be denoted as Equation 9.

$W_p$, the intensity of radiant energy 207 from the target, can be approximately calculated from the measurements $S_p$, and the radiant energy $L_p$ using Equation 10, $W_p = S_p - L_p$.

Figure 8:
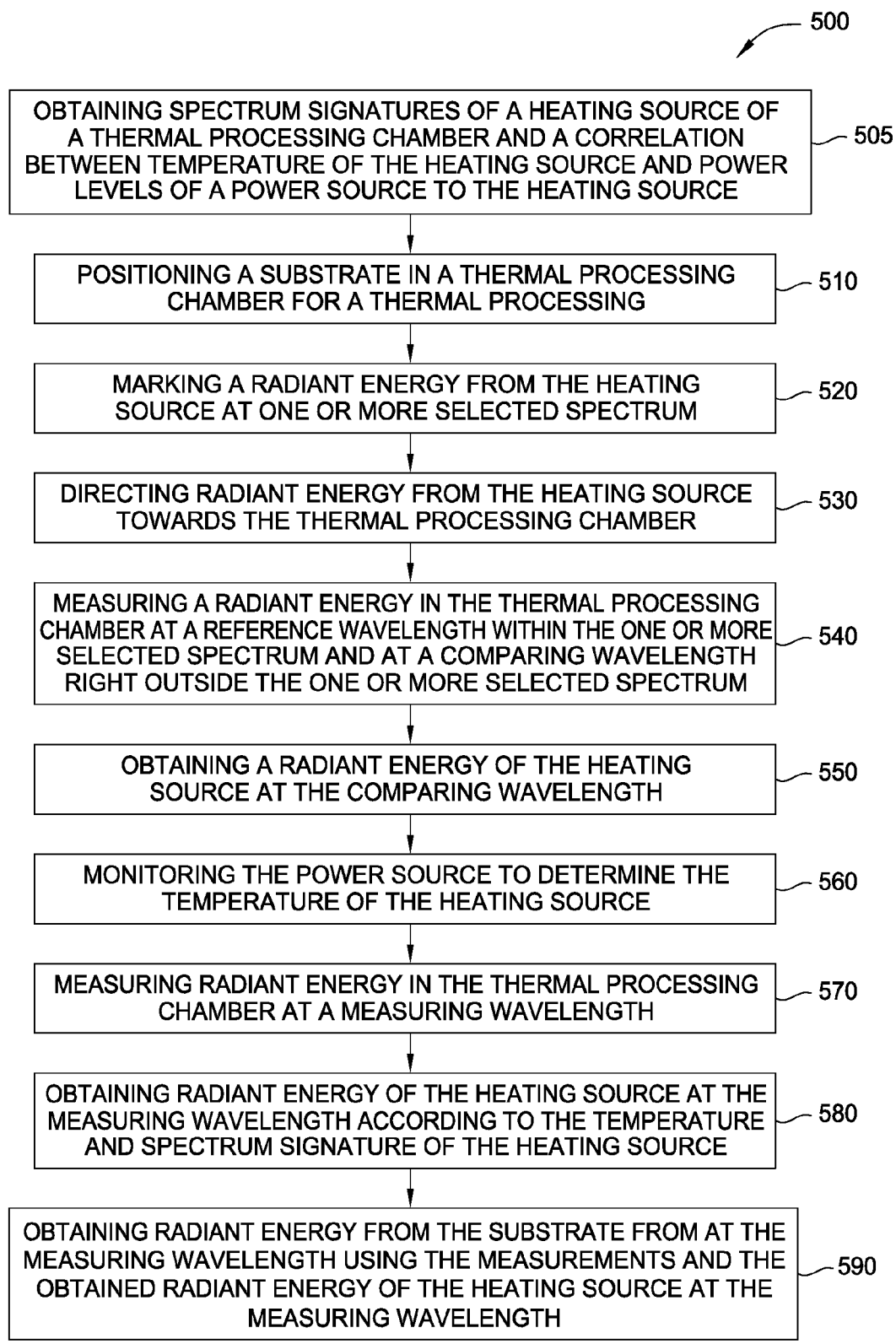
FIG. 8 is a flow chart schematically illustrating a method for measuring target temperature in accordance with another embodiment of the present invention.

FIG. 8 is a flow chart showing a method 500 for measuring temperature during thermal processing as illustrate in FIGS. 4-5.

In box 505, a spectrum signature of a heating source of a thermal processing chamber may be obtained. In one embodiment, a relationship between temperatures of the heating source and power levels of a power source to the heating source may also be obtained. In another embodiment, the heating source spectrum signature may be determined empirically as a function of power level or power levels of a power source.

In another embodiment, the heating source spectrum signature may be determined by zone influences when multizone heating is used. In multizone heating, the heating source comprises multiple heating elements each configured to direct radiant energy to a portion of processing volume. A multizone controller may control the multiple heating elements individually or by group to achieve desired heating profile. The spectrum signature of a multizone heating source may be determined empirically. The spectrum signature of the multizone heating source may comprise multiple spectrum signatures corresponding to the multiple zones. In one embodiment, an influence matrix of the multiple zones may be determined empirically to reflect influence of each zone to or by other zones, and the spectrum signature of each of the multiple zones is determined with consideration of the influence matrix. For example, an influence matrix may be obtained by determining relative contributions to each measuring radius from each zone and weighing the spectrum of each zone accordingly.

In another embodiment, two or more sets of sensors may used in determining spectrum signature of a heating source having two or more zones, with each set of sensors corresponding to one heating zone.

In box 510, a substrate is positioned in a thermal processing chamber to be thermally processed.

In box 520, radiant energy from a heating source, such as a lamp assembly, is marked at one or more selected spectrums, such as the selected spectrum 209 of FIG. 2. The marking can be performed by absorbing, reflection, polarization, or adding spikes at different wavelength across the spectrum.

In box 530, radiant energy from the heating source is directed towards the thermal processing chamber. In one embodiment, the radiant energy may be directed to the thermal processing chamber through a quartz window of the thermal processing chamber, and the marking device can be a filter lined on the quartz window.

In box 540, radiant energy in the thermal processing chamber is measured at a reference wavelength within the one or more selected spectrum and at a comparing wavelength just outside the one or more selected spectrum.

In box 550, radiant energy of the heating source at the comparing wavelength is calculated from the measurements at the reference wavelength and the comparing wavelength.

In box 560, the power source of the heating source is monitored to determine temperature of the heating source according to the obtained relationship between the power level and the temperature or alternatively the appropriate heating source spectrum.

In box 570, radiant energy is measured at a measuring wavelength, which may be chosen to be the wavelength with radiant energy most effectively reflects attributes of the substrate.

In box 580, radiant energy from the heating source at the measuring wavelength is determined from temperature of the heating source, spectrum signature of the heating source, and the obtained radiant energy of the heating source at the comparing wavelength.

In box 590, radiant energy from the substrate at the measuring wavelength can be determined using the measurement at the measuring wavelength and the obtained the radiant energy of the heating source at the measuring wavelength.

Figure 9:
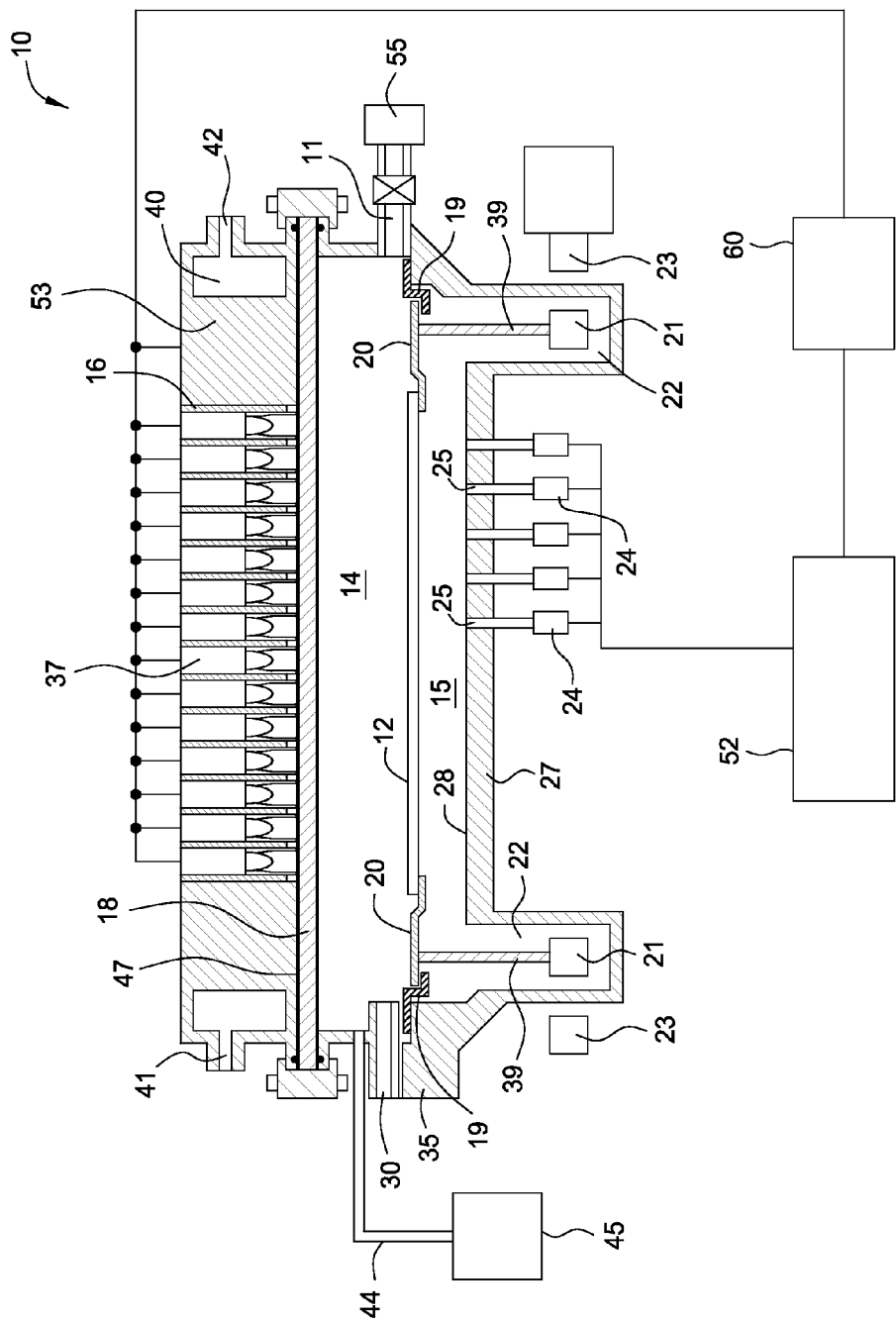
FIG. 9 is a schematic sectional side view of a rapid thermal processing chamber in accordance with one embodiment of the present invention.

FIG. 9 is a schematic sectional side view of a rapid thermal processing system 10 in accordance with one embodiment of the present invention. The rapid thermal processing system 10 comprises a chamber body 35 defining a processing volume 14 configured for annealing a disk-shaped substrate 12 therein. The chamber body 35 may be made of stainless steel and may be lined with quartz. The processing volume 14 is configured to be radiantly heated by a heating assembly 16 disposed on a quartz window 18 of the rapid thermal processing system 10. In one embodiment, the quartz window 18 may be water cooled.

A slit valve 30 may be formed on a side of the chamber body 35 providing a passage for the substrate 12 to the processing volume 14. A gas inlet 44 may be connected to a gas source 45 to provide processing gases, purge gases and/or cleaning gases to the processing volume 14. A vacuum pump 55 may be fluidly connected to the processing volume 14 through an outlet 11 for pumping out the processing volume 14.

A circular channel 22 is formed near the bottom of the chamber body 35. A magnetic rotor 21 is disposed in the circular channel 22. A tubular riser 39 rests on or is otherwise coupled to the magnetic rotor 21. The substrate 12 is supported by a peripheral edge by an edge ring 20 disposed on the tubular riser 39. A magnetic stator 23 is located externally of the magnetic rotor 21 and is magnetically coupled through the chamber body 35 to induce rotation of the magnetic rotor 21 and hence of the edge ring 20 and the substrate 12 supported thereon. The magnetic stator 23 may be also configured to adjust the elevations of the magnetic rotor 21, thus lifting the substrate 12 being processed. Additional magnetic rotation and levitation information is available in the U.S. Pat. No. 6,800,833, which is hereby incorporated by reference.

The chamber body 35 may include a reflector plate 27 near the back side of the substrate 12. The reflector plate 27 has an optical reflective surface 28 facing the back side of the substrate 12 to enhance the emissivity of the substrate 12. In one embodiment, the reflector plate 27 may be water cooled. The reflective surface 28 and the back side of the substrate 12 define a reflective cavity 15. In one embodiment, the reflector plate 27 has a diameter slightly larger than the diameter of the substrate 12 being processed. For example, if the rapid thermal processing system 10 is configured to process 12 inch substrates, the diameter of the reflector plate 27 may be about 13 inches.

In one embodiment, an outer ring 19 may be coupled between the chamber body 35 and the edge ring 20 to separate the reflective cavity 15 from the processing volume 14. The reflective cavity 15 and the processing volume 14 may have different environments.

The heating assembly 16 may comprise an array of heating elements 37. The array of heating elements 37 may be UV lamps, halogen lamps, laser diodes, resistive heaters, microwave powered heaters, light emitting diodes (LEDs), or any other suitable heating elements both singly or in combination. The array of heating elements 37 may be disposed in vertical holes formed in a reflector body 53. In one embodiment, the heating elements 37 may be arranged in a hexagon pattern. A cooling channel 40 may be formed in the reflector body 53. A coolant, such as water, may enter the reflector body 53 from an inlet 41, travel adjacent the vertical holes cooling the array of heating elements 37, and exit the reflector body from an exit 42.

The array of heating elements 37 are powered by a power source 60, which is connected to a controller 52. The controller 52 is capable of adjusting heating effects of the array of heating elements 37. In one embodiment, the array of heating elements 37 may be divided into a plurality of heating groups to heat the substrate 12 by multiple concentric zones. Each heating group may be controlled independently to provide desired temperature profile across a radius of the substrate 12. Detailed descriptions of the heating assembly 16 may be found in U.S. Pat. No. 6,350,964 and No. 6,927,169, which are hereby incorporated by reference.

In one embodiment, the controller 52 is configured to monitor power level of the power source 60 to determine temperature or spectrum of the heating elements 37.

In one embodiment, the quartz window 18 may have a marking device 47 attached thereto. The marking device 47 is configured to mark radiant energy from the array of heating elements 37 within a selected spectrum. In one embodiment, the marking device 47 may be an absorber or a reflector configured to attenuate the radiant energy from the heating elements 37 within the selected spectrum. In another embodiment, the marking device 47 may polarize or adding markers to the radiant energy directed towards the processing volume 14.

The rapid thermal processing system 10 comprises one or more thermal probe assemblies 24 configured to measure thermal properties of the substrate 12 at different radial locations. In one embodiment, the thermal probe assembly 24 may be a plurality of pyrometers optically coupled to and disposed in a plurality of apertures 25 formed in the reflector plate 27 to detect a temperature or other thermal properties of a different radial portion of the substrate 12. Detailed description of similar temperature probes may be found in the U.S. Pat. No. 5,755,511, which is hereby incorporated by reference.

In one embodiment, each of the probe assembly 24 is configured to measure radiant energy at different wavelengths, such as a reference wavelength within the selected spectrum of the marking device 47, a comparing wavelength of the selected spectrum, and a measuring wavelength chosen according to the property of the substrate 12.

The plurality of thermal probe assemblies 24 are connected with the controller 52 which may be programmed to calculate properties of the substrate 12 according to embodiments described in FIGS. 2-8.

In another embodiment, the controller 52 may be configured to conduct a closed loop control to adjust the power supplies to the array of heating elements 37 to provide a tailored radial thermal profile across the substrate 12.

Although the above discussion is focused on measuring substrate temperature in a thermal processing chamber, apparatus and methods of the present invention may be used in any suitable applications to remove background radiation noise from a sampled signal in metrology.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    directing radiant energy from an energy source towards a processing volume of a thermal processing chamber;
    marking the radiation energy directed from the energy source to the processing volume;
    positioning the substrate in the processing volume;
    measuring radiant energy within the processing volume;
    determining a characteristic of the radiant energy from the energy source using the measured radiant energy within the processing volume and the marking of the radiant energy from the energy source; and
    determining a temperature of the substrate using the measured radiant energy within the processing volume and the determined characteristic of the radiant energy from the energy source, wherein marking the radiant energy from the energy source comprises absorbing the radiant energy from the energy source at an absorbing spectrum, and measuring radiant energy within the processing volume comprises:
        measuring radiant energy at a reference wavelength within the absorbing spectrum; and
        measuring radiant energy at a comparing wavelength outside the absorbing spectrum, wherein the comparing wavelength and the reference wavelength are substantially close.

2. The method of claim 1, wherein determining the characteristics of the radiant energy from energy source comprises determining a ratio of radiant energy from the energy source and radiant energy from the substrate at the comparing wavelength from the measurements at the reference wavelength and the comparing wavelength, and determining the temperature of the substrate comprises determining the temperature of the substrate according to intensity of radiant energy from the substrate near the reference wavelength.

3. The method of claim 1, wherein measuring radiant energy within the processing volume further comprises measuring radiant energy at a measuring wavelength different from the reference wavelength and the comparing wavelength, and determining the characteristics of the radiant energy from energy source comprises determining a ratio of radiant energy from the energy source and radiant energy from the substrate at the comparing wavelength from the measurements at the reference wavelength and the comparing wavelength, and determining the temperature of the substrate comprises determining the temperature of the substrate according to intensity of radiant energy from the substrate at the measuring wavelength.

4. The method of claim 3, wherein determining the characteristic of the radiant energy from the energy source further comprises determining a spectrum signature of the energy source using a power level of the energy source and the measurements at the reference wavelength and the comparing wavelength.

5. A method for processing a substrate, comprising:
    directing radiant energy from an energy source towards a processing volume of a thermal processing chamber;
    marking the radiation energy directed from the energy source to the processing volume;
    positioning the substrate in the processing volume;
    measuring radiant energy in the processing volume at a reference wavelength;

determining a characteristic of the radiant energy from the measurement at the reference wavelength;

measuring radiant energy in the processing volume at a measuring wavelength; and determining a temperature of the substrate using measurement at the measuring wavelength and the determined characteristics of radiant energy from the energy source, wherein the characteristics of the radiant energy from the energy source is a spectrum signature of the energy source, and determining the characteristics comprises:

monitoring a power level of the energy source; and determining the spectrum signature of the energy source using measurement at the reference wavelength and the monitored power level of the energy source.

6. The method of claim 5, wherein marking the radiant energy from the energy source comprises filtering a portion of the radiant energy from the energy source within a selected spectrum by one of absorbing, reflecting or polarizing.

7. The method of claim 5, wherein determining the temperature of the substrate comprises:

determining radiant energy of the energy source at the measuring wavelength using the determined spectrum signature of the energy source; and determining radiant energy of the substrate at the measuring wavelength by subtracting radiant energy of the energy source at the measuring wavelength from measured radiant energy at the measuring wavelength.

8. A method for processing a substrate, comprising:

directing radiant energy from an energy source towards a processing volume of a thermal processing chamber;

marking the radiation energy directed from the energy source to the processing volume;

positioning the substrate in the processing volume;

measuring radiant energy in the processing volume at a reference wavelength;

determining a characteristic of the radiant energy from the measurement at the reference wavelength;

measuring radiant energy in the processing volume at a measuring wavelength; and determining a temperature of the substrate using measurement at the measuring wavelength and the determined characteristics of radiant energy from the energy source, wherein marking the radiant energy from the energy source comprises filtering a portion of the radiant energy from the energy source within a selected spectrum by one of absorbing, reflecting or polarizing, and the reference wavelength is within the selected spectrum and the measuring wavelength is outside the selected spectrum.

9. The method of claim 8, further comprising measuring radiant energy within the processing volume at a comparing wavelength, wherein the comparing wavelength is outside the selected spectrum and substantially close to the reference spectrum, and determining the characteristics of radiant energy comprises determining a ratio of the radiant energy from the energy source and from the substrate at the comparing wavelength.

* * * * *

UNITED STATES PATENT AND TRADEMARK OFFICE
CERTIFICATE OF CORRECTION

PATENT NO. : 8,761,587 B2  
APPLICATION NO. : 13/903387  
DATED : June 24, 2014  
INVENTOR(S) : Ranish et al.

Page 1 of 1

It is certified that error appears in the above-identified patent and that said Letters Patent is hereby corrected as shown below:

In the Specification

Column 7, Lines 52-54, please delete "$W_p = S_p - L$" and insert -- $W_p = S_p - L_p$ -- therefor.

Signed and Sealed this  
Seventh Day of October, 2014

Michelle K. Lee  
*Deputy Director of the United States Patent and Trademark Office*